(12) United States Patent
Dunn et al.

(10) Patent No.: US 9,202,727 B2
(45) Date of Patent: Dec. 1, 2015

(54) SUSCEPTOR HEATER SHIM

(75) Inventors: Todd Dunn, Cave Creek, AZ (US); Carl White, Gilbert, AZ (US); Michael Halpin, Scottsdale, AZ (US); Eric Shero, Phoenix, AZ (US); Jerry Winkler, Gilbert, AZ (US)

(73) Assignee: ASM IP Holding, Almere (NL)

( * ) Notice: Subject to any disclaimer, the term of this patent is extended or adjusted under 35 U.S.C. 154(b) by 265 days.

(21) Appl. No.: 13/411,271

(22) Filed: Mar. 2, 2012

(65) Prior Publication Data

US 2013/0230814 A1 Sep. 5, 2013

(51) Int. Cl.
| | | |
|---|---|---|
| F27D 5/00 | (2006.01) |
| H01L 21/67 | (2006.01) |
| F27B 17/00 | (2006.01) |
| F27D 3/00 | (2006.01) |
| H01L 21/687 | (2006.01) |

(52) U.S. Cl.
CPC ...... *H01L 21/67103* (2013.01); *F27B 17/0025* (2013.01); *F27D 3/0084* (2013.01); *F27D 5/0037* (2013.01); *H01L 21/68785* (2013.01)

(58) Field of Classification Search
USPC ............... 432/249, 259, 258, 253; 219/443.1, 219/444.1
See application file for complete search history.

(56) References Cited

U.S. PATENT DOCUMENTS

| | | |
|---|---|---|
| 2,745,640 A | 5/1956 | Cushman |
| 2,990,045 A | 9/1959 | Root |
| 3,833,492 A | 9/1974 | Bollyky |
| 3,854,443 A | 12/1974 | Baerg |
| 3,862,397 A | 1/1975 | Anderson et al. |
| 3,887,790 A | 6/1975 | Ferguson |
| 4,054,071 A | 10/1977 | Patejak |
| 4,058,430 A | 11/1977 | Suntola et al. |
| 4,145,699 A | 3/1979 | Hu et al. |
| 4,176,630 A | 12/1979 | Elmer |
| 4,181,330 A | 1/1980 | Kojima |
| 4,194,536 A | 3/1980 | Stine et al. |
| 4,322,592 A | 3/1982 | Martin |
| 4,389,973 A | 6/1983 | Suntola et al. |
| 4,393,013 A | 7/1983 | McMenamin |

(Continued)

FOREIGN PATENT DOCUMENTS

| | | |
|---|---|---|
| CN | 1563483 A | 12/2006 |
| CN | 101330015 | 12/2008 |

(Continued)

OTHER PUBLICATIONS

USPTO; Office Action dated Apr. 23, 2013 in U.S. Appl. No. 12/763,037.

(Continued)

*Primary Examiner* — Gregory A Wilson
(74) *Attorney, Agent, or Firm* — Snell & Wilmer LLP

(57) ABSTRACT

A substrate supporting assembly in a reaction space includes a heater, a substrate support member, and a shim positioned between the heater and the substrate support member. The shim may be removably secured between the heater and the substrate support member. The shim may further include an inner surface defining a perimeter of a gap. The gap may be further defined by a bottom surface of the substrate support member and a top surface of the heater. The substrate support member may further include a shoulder positioned radially outside of a substrate support position and wherein the shim inner surface is radially aligned with the substrate support member shoulder.

22 Claims, 8 Drawing Sheets

(56) References Cited

U.S. PATENT DOCUMENTS

| | | | |
|---|---|---|---|
| 4,436,674 A | 3/1984 | McMenamin | |
| 4,499,354 A | 2/1985 | Hill et al. | |
| 4,512,113 A | 4/1985 | Budinger | |
| 4,570,328 A | 2/1986 | Price et al. | |
| D288,556 S | 3/1987 | Wallgren | |
| 4,653,541 A | 3/1987 | Oehlschlaeger et al. | |
| 4,722,298 A | 2/1988 | Rubin et al. | |
| 4,735,259 A | 4/1988 | Vincent | |
| 4,753,192 A | 6/1988 | Goldsmith et al. | |
| 4,789,294 A | 12/1988 | Sato et al. | |
| 4,821,674 A | 4/1989 | deBoer et al. | |
| 4,827,430 A | 5/1989 | Aid et al. | |
| 4,882,199 A | 11/1989 | Sadoway et al. | |
| 4,986,215 A | 1/1991 | Yamada | |
| 4,991,614 A | 2/1991 | Hammel | |
| 5,062,386 A | 11/1991 | Christensen | |
| 5,074,017 A | 12/1991 | Toya et al. | |
| 5,119,760 A | 6/1992 | McMillan et al. | |
| 5,167,716 A | 12/1992 | Boitnott et al. | |
| 5,199,603 A | 4/1993 | Prescott | |
| 5,221,556 A | 6/1993 | Hawkins et al. | |
| 5,242,539 A | 9/1993 | Kumihashi et al. | |
| 5,243,195 A | 9/1993 | Nishi | |
| 5,326,427 A | 7/1994 | Jerbic | |
| 5,380,367 A | 1/1995 | Bertone | |
| 5,421,893 A | 6/1995 | Perlov | |
| 5,422,139 A | 6/1995 | Shinriki et al. | |
| 5,518,549 A | 5/1996 | Hellwig | |
| 5,595,606 A | 1/1997 | Fujikawa et al. | |
| 5,616,947 A | 4/1997 | Tamura | |
| 5,632,919 A | 5/1997 | MacCracken et al. | |
| 5,681,779 A | 10/1997 | Pasch et al. | |
| 5,695,567 A | 12/1997 | Kordina | |
| 5,730,801 A | 3/1998 | Tepman | |
| 5,732,744 A | 3/1998 | Barr et al. | |
| 5,736,314 A | 4/1998 | Hayes et al. | |
| 5,796,074 A * | 8/1998 | Edelstein et al. | 219/390 |
| 5,836,483 A | 11/1998 | Disel | |
| 5,837,320 A | 11/1998 | Hampden-Smith et al. | |
| 5,855,680 A | 1/1999 | Soininen et al. | |
| 5,920,798 A | 7/1999 | Higuchi et al. | |
| 5,979,506 A | 11/1999 | Aarseth | |
| 6,013,553 A | 1/2000 | Wallace | |
| 6,015,465 A | 1/2000 | Kholodenko et al. | |
| 6,035,101 A | 3/2000 | Sajoto et al. | |
| 6,060,691 A | 5/2000 | Minami et al. | |
| 6,074,443 A | 6/2000 | Venkatesh | |
| 6,083,321 A | 7/2000 | Lei et al. | |
| 6,086,677 A | 7/2000 | Umotoy et al. | |
| 6,122,036 A | 9/2000 | Yamasaki et al. | |
| 6,125,789 A | 10/2000 | Gupta et al. | |
| 6,129,044 A | 10/2000 | Zhao et al. | |
| 6,148,761 A | 11/2000 | Majewski et al. | |
| 6,160,244 A | 12/2000 | Ohashi | |
| 6,161,500 A | 12/2000 | Kopacz et al. | |
| 6,201,999 B1 | 3/2001 | Jevtic | |
| 6,274,878 B1 | 8/2001 | Li et al. | |
| 6,287,965 B1 | 9/2001 | Kang et al. | |
| 6,302,964 B1 | 10/2001 | Umotoy et al. | |
| 6,312,525 B1 | 11/2001 | Bright et al. | |
| D451,893 S | 12/2001 | Robson | |
| D452,220 S | 12/2001 | Robson | |
| 6,326,597 B1 | 12/2001 | Lubomirsky et al. | |
| 6,342,427 B1 | 1/2002 | Choi et al. | |
| 6,367,410 B1 | 4/2002 | Leahey et al. | |
| 6,368,987 B1 | 4/2002 | Kopacz et al. | |
| 6,383,566 B1 | 5/2002 | Zagdoun | |
| 6,410,459 B2 * | 6/2002 | Blalock et al. | 438/782 |
| 6,420,279 B1 | 7/2002 | Ono et al. | |
| 6,454,860 B2 | 9/2002 | Metzner et al. | |
| 6,478,872 B1 | 11/2002 | Chae et al. | |
| 6,482,331 B2 | 11/2002 | Lu et al. | |
| 6,483,989 B1 * | 11/2002 | Okada et al. | 392/418 |
| 6,511,539 B1 | 1/2003 | Raaijmakers | |
| 6,521,295 B1 | 2/2003 | Remington | |
| 6,534,395 B2 | 3/2003 | Werkhoven et al. | |
| 6,569,239 B2 | 5/2003 | Arai et al. | |
| 6,579,833 B1 | 6/2003 | McNallan et al. | |
| 6,590,251 B2 | 7/2003 | Kang et al. | |
| 6,594,550 B1 | 7/2003 | Okrah | |
| 6,598,559 B1 | 7/2003 | Vellore et al. | |
| 6,627,503 B2 | 9/2003 | Ma et al. | |
| 6,633,364 B2 | 10/2003 | Hayashi | |
| 6,645,304 B2 | 11/2003 | Yamaguchi | |
| 6,648,974 B1 | 11/2003 | Ogliari et al. | |
| 6,673,196 B1 | 1/2004 | Oyabu | |
| 6,682,973 B1 | 1/2004 | Paton et al. | |
| 6,709,989 B2 | 3/2004 | Ramdani et al. | |
| 6,710,364 B2 | 3/2004 | Guldi et al. | |
| 6,734,090 B2 | 5/2004 | Agarwala et al. | |
| 6,820,570 B2 | 11/2004 | Kilpela et al. | |
| 6,821,910 B2 | 11/2004 | Adomaitis et al. | |
| 6,824,665 B2 | 11/2004 | Shelnut et al. | |
| 6,847,014 B1 * | 1/2005 | Benjamin et al. | 219/444.1 |
| 6,858,524 B2 | 2/2005 | Haukka et al. | |
| 6,858,547 B2 | 2/2005 | Metzner et al. | |
| 6,863,019 B2 | 3/2005 | Shamouilian | |
| 6,874,480 B1 | 4/2005 | Ismailov | |
| 6,875,677 B1 | 4/2005 | Conley, Jr. et al. | |
| 6,884,066 B2 * | 4/2005 | Nguyen et al. | 432/250 |
| 6,884,319 B2 | 4/2005 | Kim | |
| 6,889,864 B2 | 5/2005 | Lindfors et al. | |
| 6,909,839 B2 | 6/2005 | Wang et al. | |
| 6,930,059 B2 | 8/2005 | Conley, Jr. et al. | |
| 6,935,269 B2 | 8/2005 | Lee et al. | |
| 6,955,836 B2 | 10/2005 | Kumagai et al. | |
| 6,972,478 B1 | 12/2005 | Waite et al. | |
| 7,045,430 B2 | 5/2006 | Ahn et al. | |
| 7,053,009 B2 | 5/2006 | Conley, Jr. et al. | |
| 7,071,051 B1 | 7/2006 | Jeon et al. | |
| 7,115,838 B2 | 10/2006 | Kurara et al. | |
| 7,122,085 B2 | 10/2006 | Shero et al. | |
| 7,129,165 B2 | 10/2006 | Basol et al. | |
| 7,132,360 B2 | 11/2006 | Schaeffer et al. | |
| 7,135,421 B2 | 11/2006 | Ahn et al. | |
| 7,147,766 B2 | 12/2006 | Uzoh et al. | |
| 7,172,497 B2 | 2/2007 | Basol et al. | |
| 7,192,824 B2 | 3/2007 | Ahn et al. | |
| 7,192,892 B2 | 3/2007 | Ahn et al. | |
| 7,195,693 B2 | 3/2007 | Cowans | |
| 7,204,887 B2 * | 4/2007 | Kawamura et al. | 118/725 |
| 7,205,247 B2 | 4/2007 | Lee et al. | |
| 7,235,501 B2 | 6/2007 | Ahn et al. | |
| 7,238,596 B2 | 7/2007 | Kouvetakis et al. | |
| D553,104 S | 10/2007 | Oohashi et al. | |
| 7,298,009 B2 | 11/2007 | Yan et al. | |
| D557,226 S | 12/2007 | Uchino et al. | |
| 7,312,494 B2 | 12/2007 | Ahn et al. | |
| 7,329,947 B2 * | 2/2008 | Adachi et al. | 257/706 |
| 7,357,138 B2 | 4/2008 | Ji et al. | |
| 7,393,418 B2 | 7/2008 | Yokogawa | |
| 7,393,736 B2 | 7/2008 | Ahn et al. | |
| 7,402,534 B2 | 7/2008 | Mahajani | |
| 7,405,166 B2 | 7/2008 | Liang et al. | |
| 7,405,454 B2 | 7/2008 | Ahn et al. | |
| 7,414,281 B1 | 8/2008 | Fastow | |
| 7,431,966 B2 | 10/2008 | Derderian et al. | |
| 7,437,060 B2 | 10/2008 | Wang et al. | |
| 7,442,275 B2 | 10/2008 | Cowans | |
| 7,489,389 B2 | 2/2009 | Shibazaki | |
| D593,969 S | 6/2009 | Li | |
| 7,547,363 B2 | 6/2009 | Tomiyasu et al. | |
| 7,575,968 B2 | 8/2009 | Sadaka et al. | |
| 7,589,003 B2 | 9/2009 | Kouvetakis et al. | |
| 7,601,223 B2 | 10/2009 | Lindfors et al. | |
| 7,601,225 B2 | 10/2009 | Tuominen et al. | |
| 7,640,142 B2 | 12/2009 | Tachikawa et al. | |
| 7,651,583 B2 | 1/2010 | Kent et al. | |
| D609,655 S | 2/2010 | Sugimoto | |
| 7,678,197 B2 | 3/2010 | Maki | |
| D614,153 S | 4/2010 | Fondurulia et al. | |
| 7,720,560 B2 | 5/2010 | Menser et al. | |
| 7,723,648 B2 * | 5/2010 | Tsukamoto et al. | 219/390 |
| 7,740,705 B2 | 6/2010 | Li | |

(56) References Cited

U.S. PATENT DOCUMENTS

| | | | |
|---|---|---|---|
| 7,780,440 B2 * | 8/2010 | Shibagaki et al. | 432/247 |
| 7,833,353 B2 | 11/2010 | Furukawahara et al. | |
| 7,838,084 B2 | 11/2010 | Derderian et al. | |
| 7,851,019 B2 | 12/2010 | Tuominen et al. | |
| 7,884,918 B2 | 2/2011 | Hattori | |
| D634,719 S | 3/2011 | Yasuda et al. | |
| 8,041,197 B2 * | 10/2011 | Kasai et al. | 392/418 |
| 8,055,378 B2 | 11/2011 | Numakura | |
| 8,071,451 B2 | 12/2011 | Uzoh | |
| 8,071,452 B2 | 12/2011 | Raisanen | |
| 8,072,578 B2 | 12/2011 | Yasuda | |
| 8,076,230 B2 | 12/2011 | Wei | |
| 8,082,946 B2 | 12/2011 | Laverdiere et al. | |
| 8,092,604 B2 | 1/2012 | Tomiyasu et al. | |
| 8,137,462 B2 | 3/2012 | Fondurulia et al. | |
| 8,147,242 B2 * | 4/2012 | Shibagaki et al. | 432/253 |
| 8,216,380 B2 | 7/2012 | White et al. | |
| 8,278,176 B2 | 10/2012 | Bauer et al. | |
| 8,282,769 B2 | 10/2012 | Iizuka | |
| 8,287,648 B2 | 10/2012 | Reed et al. | |
| 8,293,016 B2 | 10/2012 | Bahng et al. | |
| 8,309,173 B2 | 11/2012 | Tuominen et al. | |
| 8,323,413 B2 | 12/2012 | Son | |
| 8,367,528 B2 | 2/2013 | Bauer et al. | |
| 8,372,204 B2 | 2/2013 | Nakamura | |
| 8,444,120 B2 | 5/2013 | Gregg et al. | |
| 8,506,713 B2 | 8/2013 | Takagi | |
| D691,974 S | 10/2013 | Osada et al. | |
| 8,608,885 B2 * | 12/2013 | Goto et al. | 156/85 |
| 8,683,943 B2 | 4/2014 | Onodera et al. | |
| 8,711,338 B2 | 4/2014 | Liu et al. | |
| D705,745 S | 5/2014 | Kurs et al. | |
| 8,726,837 B2 | 5/2014 | Patalay et al. | |
| 8,728,832 B2 | 5/2014 | Raisanen et al. | |
| 8,802,201 B2 | 8/2014 | Raisanen et al. | |
| D716,742 S | 11/2014 | Jang et al. | |
| 8,877,655 B2 | 11/2014 | Shero et al. | |
| 8,883,270 B2 | 11/2014 | Shero et al. | |
| 8,933,375 B2 | 1/2015 | Dunn et al. | |
| 8,946,830 B2 | 2/2015 | Jung et al. | |
| 8,986,456 B2 | 3/2015 | Fondurulia et al. | |
| 8,993,054 B2 | 3/2015 | Jung et al. | |
| 9,005,539 B2 | 4/2015 | Halpin et al. | |
| 9,017,481 B1 | 4/2015 | Pettinger et al. | |
| 9,018,111 B2 | 4/2015 | Milligan et al. | |
| 9,021,985 B2 | 5/2015 | Alokozai et al. | |
| 9,029,253 B2 | 5/2015 | Milligan et al. | |
| 9,096,931 B2 | 8/2015 | Yednak et al. | |
| 2001/0017103 A1 | 8/2001 | Takeshita et al. | |
| 2001/0046765 A1 | 11/2001 | Cappellani et al. | |
| 2002/0001974 A1 | 1/2002 | Chan | |
| 2002/0011210 A1 | 1/2002 | Satoh et al. | |
| 2002/0064592 A1 | 5/2002 | Datta et al. | |
| 2002/0098627 A1 | 7/2002 | Pomarede et al. | |
| 2002/0108670 A1 | 8/2002 | Baker et al. | |
| 2002/0115252 A1 | 8/2002 | Haukka et al. | |
| 2002/0172768 A1 | 11/2002 | Endo et al. | |
| 2002/0187650 A1 * | 12/2002 | Blalock et al. | 438/760 |
| 2003/0019580 A1 | 1/2003 | Strang | |
| 2003/0025146 A1 | 2/2003 | Narwankar et al. | |
| 2003/0040158 A1 | 2/2003 | Saitoh | |
| 2003/0042419 A1 | 3/2003 | Katsumata et al. | |
| 2003/0066826 A1 * | 4/2003 | Lee et al. | 219/444.1 |
| 2003/0075925 A1 | 4/2003 | Lindfors et al. | |
| 2003/0094133 A1 | 5/2003 | Yoshidome et al. | |
| 2003/0111963 A1 | 6/2003 | Tolmachev et al. | |
| 2003/0141820 A1 | 7/2003 | White et al. | |
| 2003/0168001 A1 | 9/2003 | Sneh | |
| 2003/0180458 A1 | 9/2003 | Sneh | |
| 2003/0228772 A1 | 12/2003 | Cowans | |
| 2003/0232138 A1 | 12/2003 | Tuominen et al. | |
| 2004/0009679 A1 | 1/2004 | Yeo et al. | |
| 2004/0013577 A1 | 1/2004 | Ganguli et al. | |
| 2004/0018307 A1 | 1/2004 | Park et al. | |
| 2004/0018750 A1 | 1/2004 | Sophie et al. | |
| 2004/0023516 A1 | 2/2004 | Londergan et al. | |
| 2004/0036129 A1 | 2/2004 | Forbes et al. | |
| 2004/0077182 A1 | 4/2004 | Lim et al. | |
| 2004/0101622 A1 | 5/2004 | Park et al. | |
| 2004/0106249 A1 | 6/2004 | Huotari | |
| 2004/0144980 A1 | 7/2004 | Ahn et al. | |
| 2004/0168627 A1 | 9/2004 | Conley et al. | |
| 2004/0169032 A1 | 9/2004 | Murayama et al. | |
| 2004/0198069 A1 | 10/2004 | Metzner et al. | |
| 2004/0200499 A1 | 10/2004 | Harvey et al. | |
| 2004/0219793 A1 | 11/2004 | Hishiya et al. | |
| 2004/0221807 A1 | 11/2004 | Verghese et al. | |
| 2004/0266011 A1 | 12/2004 | Lee et al. | |
| 2005/0008799 A1 | 1/2005 | Tomiyasu et al. | |
| 2005/0019026 A1 | 1/2005 | Wang et al. | |
| 2005/0020071 A1 | 1/2005 | Sonobe et al. | |
| 2005/0023624 A1 | 2/2005 | Ahn et al. | |
| 2005/0054228 A1 | 3/2005 | March | |
| 2005/0066893 A1 | 3/2005 | Soininen | |
| 2005/0070123 A1 | 3/2005 | Hirano | |
| 2005/0072357 A1 | 4/2005 | Shero et al. | |
| 2005/0092249 A1 | 5/2005 | Kilpela et al. | |
| 2005/0100669 A1 | 5/2005 | Kools et al. | |
| 2005/0106893 A1 | 5/2005 | Wilk | |
| 2005/0110069 A1 | 5/2005 | Kil et al. | |
| 2005/0123690 A1 | 6/2005 | Derderian et al. | |
| 2005/0173003 A1 | 8/2005 | Laverdiere et al. | |
| 2005/0187647 A1 | 8/2005 | Wang et al. | |
| 2005/0212119 A1 | 9/2005 | Shero | |
| 2005/0214457 A1 | 9/2005 | Schmitt et al. | |
| 2005/0214458 A1 | 9/2005 | Meiere | |
| 2005/0218462 A1 | 10/2005 | Ahn et al. | |
| 2005/0229848 A1 | 10/2005 | Shinriki | |
| 2005/0229972 A1 | 10/2005 | Hoshi et al. | |
| 2005/0241176 A1 | 11/2005 | Shero et al. | |
| 2005/0263075 A1 | 12/2005 | Wang et al. | |
| 2005/0271813 A1 | 12/2005 | Kher et al. | |
| 2005/0282101 A1 * | 12/2005 | Adachi | 432/253 |
| 2005/0287725 A1 | 12/2005 | Kitagawa | |
| 2006/0013946 A1 | 1/2006 | Park et al. | |
| 2006/0014384 A1 | 1/2006 | Lee et al. | |
| 2006/0019033 A1 | 1/2006 | Muthukrishnan et al. | |
| 2006/0024439 A2 | 2/2006 | Tuominen et al. | |
| 2006/0046518 A1 | 3/2006 | Hill et al. | |
| 2006/0051925 A1 | 3/2006 | Ahn et al. | |
| 2006/0060930 A1 | 3/2006 | Metz et al. | |
| 2006/0062910 A1 | 3/2006 | Meiere | |
| 2006/0063346 A1 | 3/2006 | Lee et al. | |
| 2006/0068125 A1 | 3/2006 | Radhakrishnan | |
| 2006/0110934 A1 | 5/2006 | Fukuchi | |
| 2006/0113675 A1 | 6/2006 | Chang et al. | |
| 2006/0128168 A1 | 6/2006 | Ahn et al. | |
| 2006/0148180 A1 | 7/2006 | Ahn et al. | |
| 2006/0163612 A1 | 7/2006 | Kouvetakis et al. | |
| 2006/0193979 A1 | 8/2006 | Meiere et al. | |
| 2006/0208215 A1 | 9/2006 | Metzner et al. | |
| 2006/0213439 A1 | 9/2006 | Ishizaka | |
| 2006/0223301 A1 | 10/2006 | Vanhaelemeersch et al. | |
| 2006/0226117 A1 | 10/2006 | Bertram et al. | |
| 2006/0228888 A1 | 10/2006 | Lee et al. | |
| 2006/0240574 A1 | 10/2006 | Yoshie | |
| 2006/0257563 A1 | 11/2006 | Doh et al. | |
| 2006/0257584 A1 | 11/2006 | Derderian et al. | |
| 2006/0258078 A1 | 11/2006 | Lee et al. | |
| 2006/0266289 A1 | 11/2006 | Verghese et al. | |
| 2007/0010072 A1 | 1/2007 | Bailey et al. | |
| 2007/0020953 A1 | 1/2007 | Tsai et al. | |
| 2007/0022954 A1 | 2/2007 | Iizuka et al. | |
| 2007/0028842 A1 | 2/2007 | Inagawa et al. | |
| 2007/0031598 A1 | 2/2007 | Okuyama et al. | |
| 2007/0031599 A1 | 2/2007 | Gschwandtner et al. | |
| 2007/0037412 A1 | 2/2007 | Dip et al. | |
| 2007/0042117 A1 | 2/2007 | Kupurao et al. | |
| 2007/0049053 A1 | 3/2007 | Mahajani | |
| 2007/0059948 A1 | 3/2007 | Metzner et al. | |
| 2007/0065578 A1 | 3/2007 | McDougall | |
| 2007/0066010 A1 | 3/2007 | Ando | |
| 2007/0054405 A1 | 4/2007 | Kim | |
| 2007/0077355 A1 | 4/2007 | Chacin et al. | |

(56) References Cited

U.S. PATENT DOCUMENTS

| | | |
|---|---|---|
| 2007/0096194 A1 | 5/2007 | Streck et al. |
| 2007/0116873 A1 | 5/2007 | Li et al. |
| 2007/0134942 A1 | 6/2007 | Ahn et al. |
| 2007/0146621 A1 | 6/2007 | Yeom |
| 2007/0155138 A1 | 7/2007 | Tomasini et al. |
| 2007/0163440 A1 | 7/2007 | Kim et al. |
| 2007/0166457 A1 | 7/2007 | Yamoto et al. |
| 2007/0175397 A1 | 8/2007 | Tomiyasu et al. |
| 2007/0209590 A1 | 9/2007 | Li |
| 2007/0232501 A1 | 10/2007 | Tonomura |
| 2007/0237697 A1 | 10/2007 | Clark |
| 2007/0249131 A1 | 10/2007 | Allen et al. |
| 2007/0252244 A1 | 11/2007 | Srividya et al. |
| 2007/0264807 A1 | 11/2007 | Leone et al. |
| 2008/0006208 A1 | 1/2008 | Ueno et al. |
| 2008/0029790 A1 | 2/2008 | Ahn et al. |
| 2008/0054332 A1 | 3/2008 | Kim et al. |
| 2008/0057659 A1 | 3/2008 | Forbes et al. |
| 2008/0075881 A1 | 3/2008 | Won et al. |
| 2008/0085226 A1 | 4/2008 | Fondurulia et al. |
| 2008/0113096 A1 | 5/2008 | Mahajani |
| 2008/0113097 A1 | 5/2008 | Mahajani et al. |
| 2008/0124908 A1 | 5/2008 | Forbes et al. |
| 2008/0149031 A1 | 6/2008 | Chu et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0237572 A1 | 10/2008 | Chui et al. |
| 2008/0248310 A1 | 10/2008 | Kim et al. |
| 2008/0261413 A1 | 10/2008 | Mahajani |
| 2008/0282970 A1 | 11/2008 | Heys et al. |
| 2008/0315292 A1 | 12/2008 | Ji et al. |
| 2009/0000550 A1 | 1/2009 | Tran et al. |
| 2009/0011608 A1 | 1/2009 | Nabatame |
| 2009/0020072 A1 | 1/2009 | Mizunaga et al. |
| 2009/0029564 A1 | 1/2009 | Yamashita et al. |
| 2009/0035947 A1 | 2/2009 | Horii |
| 2009/0061644 A1 | 3/2009 | Chiang et al. |
| 2009/0085156 A1 | 4/2009 | Dewey et al. |
| 2009/0093094 A1 | 4/2009 | Ye et al. |
| 2009/0095221 A1 | 4/2009 | Tam et al. |
| 2009/0107404 A1 | 4/2009 | Ogliari et al. |
| 2009/0136668 A1 | 5/2009 | Gregg et al. |
| 2009/0139657 A1 | 6/2009 | Lee et al. |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0261331 A1 | 10/2009 | Yang et al. |
| 2009/0277510 A1 | 11/2009 | Shikata |
| 2009/0283041 A1 | 11/2009 | Tomiyasu et al. |
| 2009/0289300 A1 | 11/2009 | Sasaki et al. |
| 2010/0024727 A1 | 2/2010 | Kim et al. |
| 2010/0025796 A1 | 2/2010 | Dabiran |
| 2010/0055312 A1 | 3/2010 | Kato et al. |
| 2010/0075507 A1 | 3/2010 | Chang et al. |
| 2010/0102417 A1 | 4/2010 | Ganguli et al. |
| 2010/0124610 A1 | 5/2010 | Aikawa et al. |
| 2010/0130017 A1 | 5/2010 | Luo et al. |
| 2010/0162752 A1 | 7/2010 | Tabata et al. |
| 2010/0170441 A1 | 7/2010 | Won et al. |
| 2010/0193501 A1* | 8/2010 | Zucker et al. ............ 219/443.1 |
| 2010/0230051 A1 | 9/2010 | Iizuka |
| 2010/0255198 A1 | 10/2010 | Cleary et al. |
| 2010/0275846 A1 | 11/2010 | Kitagawa |
| 2010/0294199 A1 | 11/2010 | Tran et al. |
| 2010/0307415 A1 | 12/2010 | Shero et al. |
| 2010/0322604 A1 | 12/2010 | Fondurulia et al. |
| 2011/0000619 A1 | 1/2011 | Suh |
| 2011/0061810 A1 | 3/2011 | Ganguly et al. |
| 2011/0070380 A1 | 3/2011 | Shero et al. |
| 2011/0089469 A1 | 4/2011 | Merckling |
| 2011/0097901 A1 | 4/2011 | Banna et al. |
| 2011/0108194 A1 | 5/2011 | Yoshioka et al. |
| 2011/0236600 A1 | 9/2011 | Fox et al. |
| 2011/0239936 A1 | 10/2011 | Suzaki et al. |
| 2011/0254052 A1 | 10/2011 | Kouvetakis |
| 2011/0256734 A1 | 10/2011 | Hausmann et al. |
| 2011/0275166 A1 | 11/2011 | Shero et al. |
| 2011/0308460 A1 | 12/2011 | Hong et al. |
| 2012/0024479 A1 | 2/2012 | Palagashvili et al. |
| 2012/0070136 A1 | 3/2012 | Koelmel et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0114877 A1 | 5/2012 | Lee |
| 2012/0156108 A1 | 6/2012 | Fondurulia et al. |
| 2012/0160172 A1 | 6/2012 | Wamura et al. |
| 2012/0240858 A1 | 9/2012 | Taniyama et al. |
| 2012/0270393 A1 | 10/2012 | Pore et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2012/0318334 A1 | 12/2012 | Bedell et al. |
| 2012/0321786 A1 | 12/2012 | Satitpunwaycha et al. |
| 2013/0023129 A1 | 1/2013 | Reed |
| 2013/0104988 A1 | 5/2013 | Yednak et al. |
| 2013/0104992 A1 | 5/2013 | Yednak et al. |
| 2013/0115383 A1 | 5/2013 | Lu et al. |
| 2013/0126515 A1 | 5/2013 | Shero et al. |
| 2013/0129577 A1 | 5/2013 | Halpin et al. |
| 2013/0230814 A1 | 9/2013 | Dunn et al. |
| 2013/0256838 A1 | 10/2013 | Sanchez et al. |
| 2013/0264659 A1 | 10/2013 | Jung |
| 2013/0292676 A1 | 11/2013 | Milligan et al. |
| 2013/0292807 A1 | 11/2013 | Raisanen et al. |
| 2013/0330911 A1 | 12/2013 | Huang et al. |
| 2014/0000843 A1 | 1/2014 | Dunn et al. |
| 2014/0014644 A1* | 1/2014 | Akiba et al. ............ 219/444.1 |
| 2014/0020619 A1 | 1/2014 | Vincent et al. |
| 2014/0027884 A1 | 1/2014 | Fang et al. |
| 2014/0036274 A1 | 2/2014 | Marquardt et al. |
| 2014/0060147 A1 | 3/2014 | Sarin et al. |
| 2014/0067110 A1 | 3/2014 | Lawson et al. |
| 2014/0073143 A1 | 3/2014 | Alokozai et al. |
| 2014/0077240 A1 | 3/2014 | Roucka et al. |
| 2014/0084341 A1 | 3/2014 | Weeks |
| 2014/0087544 A1 | 3/2014 | Tolle |
| 2014/0103145 A1 | 4/2014 | White et al. |
| 2014/0120487 A1* | 5/2014 | Kaneko ............ 432/250 |
| 2014/0159170 A1 | 6/2014 | Raisanen et al. |
| 2014/0175054 A1 | 6/2014 | Carlson et al. |
| 2014/0217065 A1 | 8/2014 | Winkler et al. |
| 2014/0220247 A1 | 8/2014 | Haukka et al. |
| 2014/0225065 A1 | 8/2014 | Rachmady et al. |
| 2014/0251953 A1 | 9/2014 | Winkler et al. |
| 2014/0251954 A1 | 9/2014 | Winkler et al. |
| 2014/0346650 A1 | 11/2014 | Raisanen et al. |
| 2015/0004316 A1 | 1/2015 | Thompson et al. |
| 2015/0014632 A1 | 1/2015 | Kim et al. |
| 2015/0024609 A1 | 1/2015 | Milligan et al. |
| 2015/0048485 A1 | 2/2015 | Tolle |
| 2015/0091057 A1 | 4/2015 | Xie et al. |
| 2015/0096973 A1 | 4/2015 | Dunn et al. |
| 2015/0132212 A1 | 5/2015 | Winkler et al. |
| 2015/0140210 A1 | 5/2015 | Jung et al. |
| 2015/0147877 A1 | 5/2015 | Jung |
| 2015/0167159 A1 | 6/2015 | Halpin et al. |
| 2015/0184291 A1 | 7/2015 | Alokozai et al. |
| 2015/0187568 A1 | 7/2015 | Pettinger et al. |

FOREIGN PATENT DOCUMENTS

| | | |
|---|---|---|
| CN | 101522943 | 9/2009 |
| CN | 101423937 A | 9/2011 |
| EP | 2036600 | 3/2009 |
| JP | 07283149 | 10/1995 |
| JP | 08335558 | 12/1996 |
| JP | 2001342570 | 12/2001 |
| JP | 2004014952 A | 1/2004 |
| JP | 2004091848 | 3/2004 |
| JP | 2004538374 | 12/2004 |

(56) References Cited

FOREIGN PATENT DOCUMENTS

| | | |
|---|---|---|
| JP | 2005507030 | 3/2005 |
| JP | 2006186271 | 7/2006 |
| JP | 2008527448 | 7/2008 |
| TW | I226380 | 1/2005 |
| TW | 200701301 A | 1/2007 |
| WO | 2006/056091 A1 | 6/2006 |
| WO | 2006/078666 | 7/2006 |

OTHER PUBLICATIONS

USPTO; Office Action dated Jan. 15, 2013 in U.S. Appl. No. 12/754,223.
USPTO; Office Action dated Feb. 26, 2013 in U.S. Appl. No. 12/754,223.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 is Serial No. 201080015699.9.
Novaro et al. Theoretical Study on a Reaction Pathway of Ziegler-Natta-Type Catalysis, J. Chem. Phys. 68(5), Mar. 1, 1978 p. 2337-2351.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Restriction Requirement dated Dec. 16, 2013 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Restriction Requirement dated Oct. 29, 2013 in U.S. Appl. No. 13/439,258.
USPTO; Office Action dated Mar. 24, 2014 in U.S. Appl. No. 13/439,258.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Office Action dated Nov. 15, 2013 in U.S. Appl. No. 13/612,538.
USPTO; Office Action dated Apr. 24, 2014 in U.S. Appl. No. 13/784,362.
Chinese Patent Office; Notice on the First Office Action dated May 24, 2013 in Serial No. 201080036764.6.
Chinese Patent Office; Notice on the Second Office Action in Serial No. 201080036764.6 dated Jan. 2, 2014.
Japanese Patent Office; Office Action dated Dec. 25, 2014 in Serial No. 2012-504786.
USPTO; Office Action dated Aug. 27, 2010 in U.S. Appl. No. 12/118,596.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
PCT; International Search report and Written Opinion dated Nov. 12, 2010 in Application No. PCT/US2010/030126.
PCT; International Search report and Written Opinion dated Jan. 12, 2011 in Application No. PCT/US2010/045368.
Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.
USPTO; Office Action dated Oct. 8, 2014 in U.S. Appl. No. 12/763,037.
USPTO; Non-Final Office Action dated Sep. 17, 2014 in U.S. Appl. No. 13/187,300.
USPTO; Non-Final Office Action dated Nov. 26, 2014 in U.S. Appl. No. 13/312,591.
UPPTO; Notice of Allowance dated Oct. 21, 2014 in U.S. Appl. No. 13/439,528.
USPTO; Notice of Allowance dated Oct. 23, 2014 in U.S. Appl. No. 13/535,214.
USPTO; Non-Final Office Action dated Oct. 15, 2014 in U.S. Appl. No. 13/597,043.
USPTO; Final Office Action dated Nov. 14, 2014 in U.S. Appl. No. 13/677,151.
USPTO; Non-Final Office Action dated Oct. 9, 2014 in U.S. Appl. No. 13/874,708.
USPTO; Non-Final Office Action dated Sep. 19, 2014 in U.S. Appl. No. 13/791,246.
USPTO; Non-Final Office Action dated Sep. 12, 2014 in U.S. Appl. No. 13/941,134.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Final Office Action dated Nov. 7, 2014 in U.S. Appl. No. 14/183,187.
Chinese Patent Office; Notice on the Second Office Action dated Sep. 16, 2014 in Application No. 201110155056.
Koutsokeras et al. Texture and Microstructure Evolution in Single-Phase TixTa1-xN Alloys of Rocksalt Structure. Journal of Applied Physics, 110, pp. 043535-1-043535-6, (2011).
USPTO; Non-Final Office Action dated Mar. 25, 2015 in U.S. Appl. No. 12/754,223.

(56) References Cited

OTHER PUBLICATIONS

USPTO; Final Office Action dated Apr. 15, 2015 in U.S. Appl. No. 13/187,300.
USPTO; Final Office Action dated Mar. 20, 2015 in U.S. Appl. No. 13/312,591.
USPTO; Non-Final Office Action dated Apr. 3, 2015 in U.S. Appl. No. 13/677,133.
USPTO; Final Office Action dated Mar. 25, 2015 in U.S. Appl. No. 13/791,246.
USPTO; Non-Final Office Action dated Apr. 28, 2015 in U.S. Appl. No. 14/040,196.
USPTO; Non-Final Office Action dated Mar. 19, 2015 in U.S. Appl. No. 14/079,302.
USPTO; Non-Final Office Action dated Mar. 19, 2015 in U.S. Appl. No. 14/166,462.
Crowell, "Chemical methods of thin film deposition: Chemical vapor deposition, atomic layer deposition, and related technologies," Journal of Vacuum Science & Technology A 21.5, (2003): S88-S95.
USPTO; Final Office Action dated Aug. 12, 2015 in U.S. Appl. No. 12/754,223.
USPTO; Non-Final Office Action dated Jun. 17, 2015 in U.S. Appl. No. 13/283,408.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Notice of Allowance dated Aug. 4, 2015 in U.S. Appl. No. 13/677,133.
USPTO; Non-Final Office Action dated Jul. 30, 2015 in U.S. Appl. No. 13/941,216.
USPTO; Non-Final Office Action dated Jun. 29, 2015 in U.S. Appl. No. 13/966,782.
USPTO; Final Office Action dated Jul. 14, 2015 in U.S. Appl. No. 14/457,058.
USPTO; Notice of Allowance dated Jul. 6, 2015 in U.S. Appl. No. 29/447,298.
USPTO; Notice of Allowance dated May 14, 2015 in U.S. Appl. No. 13/312,591.
USPTO; Final Office Action dated Jun. 1, 2015 in U.S. Appl. No. 13/597,108.
USPTO; Non-Final Office Action dated May 28, 2015 in U.S. Appl. No. 13/651,144.
USPTO; Non-Final Office Action dated Apr. 7, 2015 in U.S. Appl. No. 14/018,345.
USPTO; Non-Final Office Action dated Mar. 16, 2015 in U.S. Appl. No. 29/447,298.
Bearzotti, et al., "Fast Humidity Response of a Metal Halide-Doped Novel Polymer," Sensors and Actuators B, 7, pp. 451-454, (1992).
Varma, et al., "Effect of Mtal Halides on Thermal, Mechanical, and Electrical Properties of Polypyromelitimide Films," Journal of Applied Polymer Science, vol. 32, pp. 3987-4000, (1986).
USPTO; Final Office Action dated Jul. 14, 2014 in U.S. Appl. No. 12/754,223.
USPTO; Notice of Allowance dated Jul. 3, 2014 in U.S. Appl. No. 13/102,980.
USPTO; Office Action dated Jun. 3, 2014 in U.S. Appl. No. 12/854,818.
USPTO; Non-Final Office Action dated Jul. 2, 2014 in U.S. Appl. No. 13/283,408.
USPTO; Non-Final Office Action dated Jul. 30, 2014 in U.S. Appl. No. 13/284,642.
USPTO Final Office Action dated Jul. 8, 2014 in U.S. Appl. No. 13/439,528.
USPTO; Final Office Action dated Jun. 18, 2014 in U.S. Appl. No. 13/535,214.
USPTO; Non-Final Office Action dated Aug. 8, 2014 in U.S. Appl. No. 13/563,066.
USPTO; Non-Final Office Action dated Jul. 10, 2014 in U.S. Appl. No. 13/612,538.
USPTO; Non-Final Office Action dated Jun. 2, 2014 in U.S. Appl. No. 13/677,151.
USPTO; Notice of Allowance dated Aug. 13, 2014 in U.S. Appl. No. 13/784,362.
USPTO; Restriction Requirement dated Jun. 26, 2014 in U.S. Appl. No. 13/874,708.
USPTO; Non-Final Office Action dated May 29, 2014 in U.S. Appl. No. 14/183,187.
Chinese Patent Office; Notice on the Third Office Action dated Jul. 1, 2014 in Application No. 201080036764.6.
Taiwan Patent Office; Office Action dated Jul. 4, 2014 in Application No. 099110511.
USPTO; Notice of Allowance dated Jan. 27, 2015 in U.S. Appl. No. 12/763,037.
USPTO; Final Office Action dated Jan. 29, 2015 in U.S. Appl. No. 13/283,408.
USPTO; Notice of Allowance dated Feb. 11, 2015 in U.S. Appl. No. 13/284,642.
USPTO; Final Office Action dated Jan. 16, 2015 in U.S. Appl. No. 13/411,271.
USPTO; Final Office Action dated Feb. 12, 2015 in U.S. Appl. No. 13/563,066.
USPTO; Final Office Action dated Mar. 13, 2015 in U.S. Appl. No. 13/597,043.
USPTO; Non-Final Office Action dated Feb. 12, 2015 in U.S. Appl. No. 13/597,108.
USPTO; Notice of Allowance dated Feb. 26, 2015 in U.S. Appl. No. 13/677,151.
USPTO; Notice of Allowance dated Mar. 10, 2015 in U.S. Appl. No. 13/874,708.
USPTO; Notice of Allowance dated Jan. 20, 2015 in U.S. Appl. No. 13/941,134.
USPTO; Non-Final Office Action dated Mar. 16, 2015 in U.S. Appl. No. 14/183,187.
USPTO; Non-Final Office Action dated Feb. 12, 2015 in U.S. Appl. No. 14/457,058.
USPTO; Non-Final Office Action dated Jan. 16, 2015 in U.S. Appl. No. 14/563,044.
Chinese Patent Office; Office Action dated Jan. 12, 2015 in Application No. 201080015699.9.
Chinese Patent Office; Notice on the Third Office Action dated Feb. 9, 2015 in Application No. 201110155056.
Taiwan Patent Office; Office Action dated Dec. 30, 2014 in Application No. 099114330.
Taiwan Patent Office; Office Action dated Dec. 19, 2014 in Application No. 099127063.

* cited by examiner

SUSCEPTOR HEATER SHIM

FIELD OF THE DISCLOSURE

This disclosure relates generally to semiconductor processing, and more particularly to a susceptor and susceptor heater providing a more uniform heat distribution to a substrate.

BACKGROUND

Semiconductor fabrication processes are typically conducted with the substrates supported within a chamber under controlled conditions. For many purposes, semiconductor substrates (e.g., wafers) are heated inside the process chamber. For example, substrates can be heated by direct physical contact with an internally heated wafer holder or "chuck." "Susceptors" are wafer supports used in systems where the wafer and susceptors absorb heat.

Some of the important controlled conditions for processing include, but are not limited to, fluid flow rate into the chamber, temperature of the reaction chamber, temperature of the fluid flowing into the reaction chamber, and temperature of the fluid throughout the fluid line.

Heating within the reaction chamber can occur in a number of ways, including lamp banks or arrays positioned above the substrate surface for directly heating the susceptor or susceptor heaters/pedestal heaters position below the susceptor. Traditionally, the pedestal style heater extends into the chamber through a bottom wall and the susceptor is mounted on a top surface of the heater. The heater may include a resistive heating element enclosed within the heater to provide conductive heat and increase the susceptor temperature. A major drawback to the resistive pedestal heater is the great deal of heat necessary in order to sufficiently raise the top surface temperature of the susceptor. In order to provide this high level of heat transfer, the pedestal heater and the susceptor interface becomes very hot and may lead to fusion between the two parts. Unfortunately, fusing the susceptor and heater together leads to increased reaction chamber downtime and additional refurbishment/replacement costs.

SUMMARY

Various aspects and implementations are disclosed herein that relate to substrate support assembly designs and methods of heating a substrate within a reaction chamber. In one aspect, a substrate supporting assembly in a reaction space includes a heater, a substrate support member, and a shim positioned between the heater and the substrate support member.

In an implementation, the shim may be removably secured between the heater and the substrate support member. The shim may further include an inner surface defining a perimeter of a gap. The gap may be further defined by a bottom surface of the substrate support member and a top surface of the heater. The substrate support member may further include a shoulder positioned radially outside of a substrate support position and wherein the shim inner surface is radially aligned with the substrate support member shoulder.

A temperature of the substrate support member may be modified by both conductive thermal energy and radiant thermal energy from the heater. The radiant thermal energy from the heater may be transferred through the gap. The reaction chamber may under a vacuum condition during substrate processing. The radiant thermal energy transfer component may be greater than the conductive thermal energy transfer component. The shim may be composed of a material selected from the group consisting of aluminum, titanium, and stainless steel. The shim may further include a cross-sectional thickness between 0.1 mm and 2 mm. The shim cross-sectional thickness may be 0.5 mm. The shim may include a radially non-uniform cross-sectional thickness. The shim cross-sectional thickness may increase from a shim inner surface to a shim outer surface. The shim may further include a plurality of locating tabs for maintaining a position of the shim on the heater or the substrate support member. The shim may be a solid disc.

In another aspect, a reaction chamber for processing a wafer may include a plurality of walls defining a reaction space, a heater movably positioned within the reaction space, a susceptor positioned within the reaction space, and a shim located between the heater and the susceptor and preventing direct contact between the heater and the susceptor.

In an implementation, the shim may be removably secured between the heater and the susceptor. A gap may be formed between an inner surface of the shim, a bottom surface of the susceptor, and a top surface of the heater, and wherein the gap is positioned inward of a radial envelope defined by an outer perimeter of the wafer. The shim may be composed of a material selected from the group consisting of aluminum, titanium, and stainless steel.

In yet another aspect, a method of heating a susceptor includes the steps of providing a heater having a heating element within a reaction chamber, placing a shim on the heater, placing a susceptor on the shim, activating the heating element, and transferring thermal energy from the heater to the susceptor by conduction and radiation.

In an implementation, the method may also include the step of placing the reaction chamber under a vacuum during a wafer processing step.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

The present aspects and implementations may be described in terms of functional block components and various processing steps. Such functional blocks may be realized by any number of hardware or software components configured to perform the specified functions and achieve the various results. For example, the present aspects may employ various sensors, detectors, flow control devices, heaters, and the like, which may carry out a variety of functions. In addition, the present aspects and implementations may be practiced in conjunction with any number of processing methods, and the apparatus and systems described may employ any number of processing methods, and the apparatus and systems described are merely examples of applications of the invention.

Figure 1:
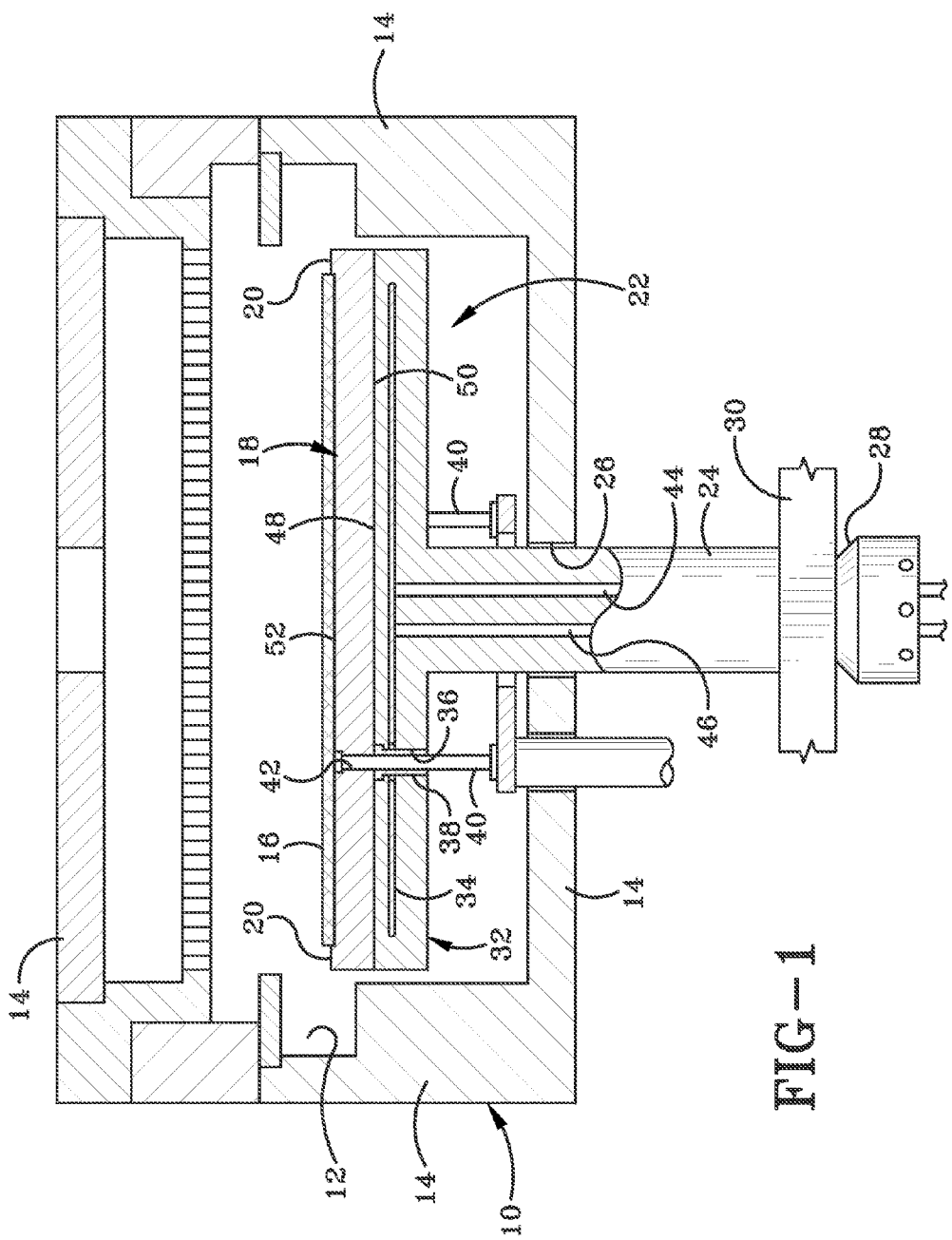
FIG. 1 is a partial cross-sectional view of a reaction chamber with a substrate, susceptor, and heater.

FIG. 1 illustrates a reaction or processing chamber 10 defining a processing space 12 therein which is enclosed by walls 14. One or more of walls 14 may be moveable to allow a substrate or wafer 16 to be positioned within processing space 12. Specifically, wafer 16 is positioned on a susceptor or substrate support member 18 between a shoulder 20. Shoulder 20 is a raised portion near the periphery of susceptor 18 and assists in positioning the wafer 16 for consistent processing.

Susceptor 18 rests on a heater 22 which may be a pedestal heater or any other suitable heating mechanism. Heater 22 may include a shaft portion 24 extending through an opening 26 in wall 14. Shaft portion 24 may also include a collar 28 communicating with a lifting mechanism 30 for moving the heater 22 and the susceptor 18 from a loading position to a processing position and back as necessary.

Heater 22 includes a heating portion 32 generally perpendicular to shaft portion 24. Heating portion 32 is also generally shaped and sized similar to susceptor 18 to provide a uniform heat distribution to the susceptor 18 and ultimately the substrate 16. While the heating portion 32 is shown and described as being integral with the shaft portion 24, it is within the spirit and scope of the present disclosure for the heating portion and shaft portion to be separate pieces that are permanently secured to one another, are removably secured to one another, are formed from a single piece, or to even omit the shaft portion so long as the susceptor is sufficiently heated for processing.

Heating portion 32 includes a heating element 34 which may be a resistive heater and positioned within a diameter defined by substrate 16. In one implementation, the heating element 34 is looped outward from a central point within heating portion 32. In another implementation, the heating element snakes in a regular pattern from the inside to the outside. While the described orientations of heating element 34 have been described as various implementations, the orientation, style, and arrangement of heating element 34 are merely non-limiting examples as any suitable heating element style and orientation may be utilized without departing from the spirit and scope of this disclosure.

As partially seen in FIG. 1, a plurality of through holes 36 extend through heating portion 32 and are arranged to receive a sleeve 38 therein. Advantageously, lift pins 40 may then traverse through sleeve 38 and through holes 42 in susceptor 18 to raise and lower substrate 16 for loading and unloading.

Shaft portion 24 may also include an inlet 44 and an outlet 46 which are arranged to carry wiring and other requirement components to provide heating at the heating portion 32. Advantageously, inlet 44 and outlet 46 are incorporated through shaft portion 24 instead of directly into heating portion 32 to reduce potential contamination issues within reaction chamber 10. In this arrangement, the susceptor 18 is positioned directly in contact with heater 22 and particularly a top surface 48 of heating portion 32 contacts a bottom surface 50 of susceptor 18.

Figure 2:
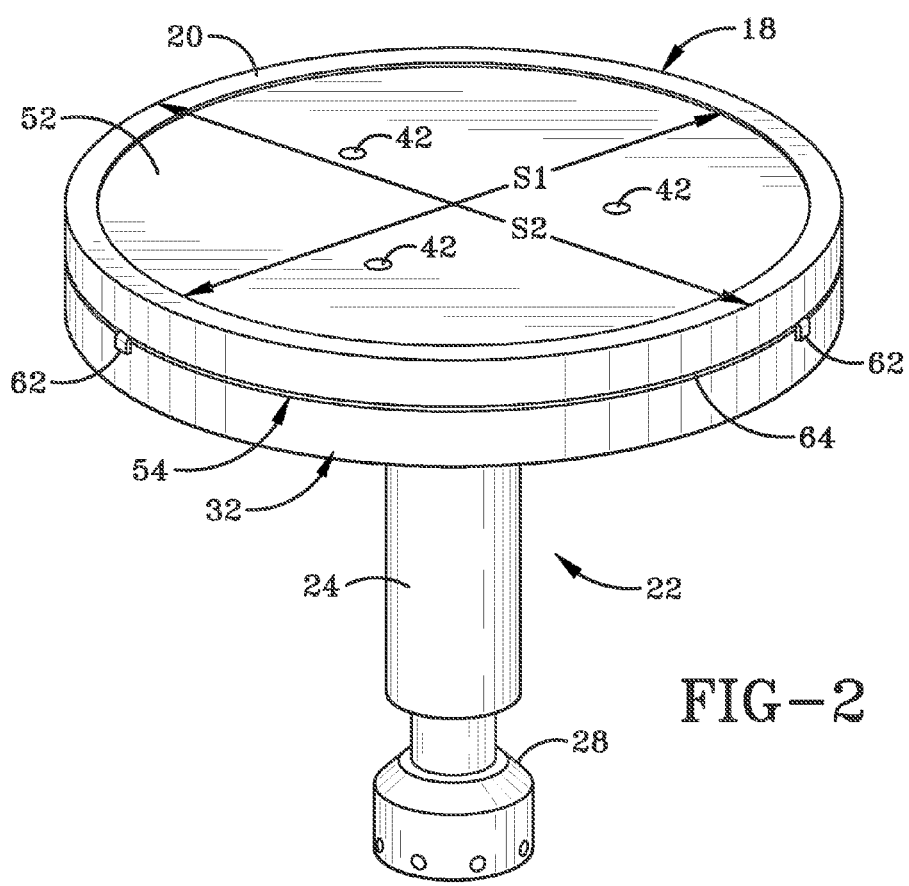
FIG. 2 is a perspective view of a substrate support assembly with a shim removed from a reaction chamber.
Figure 3:
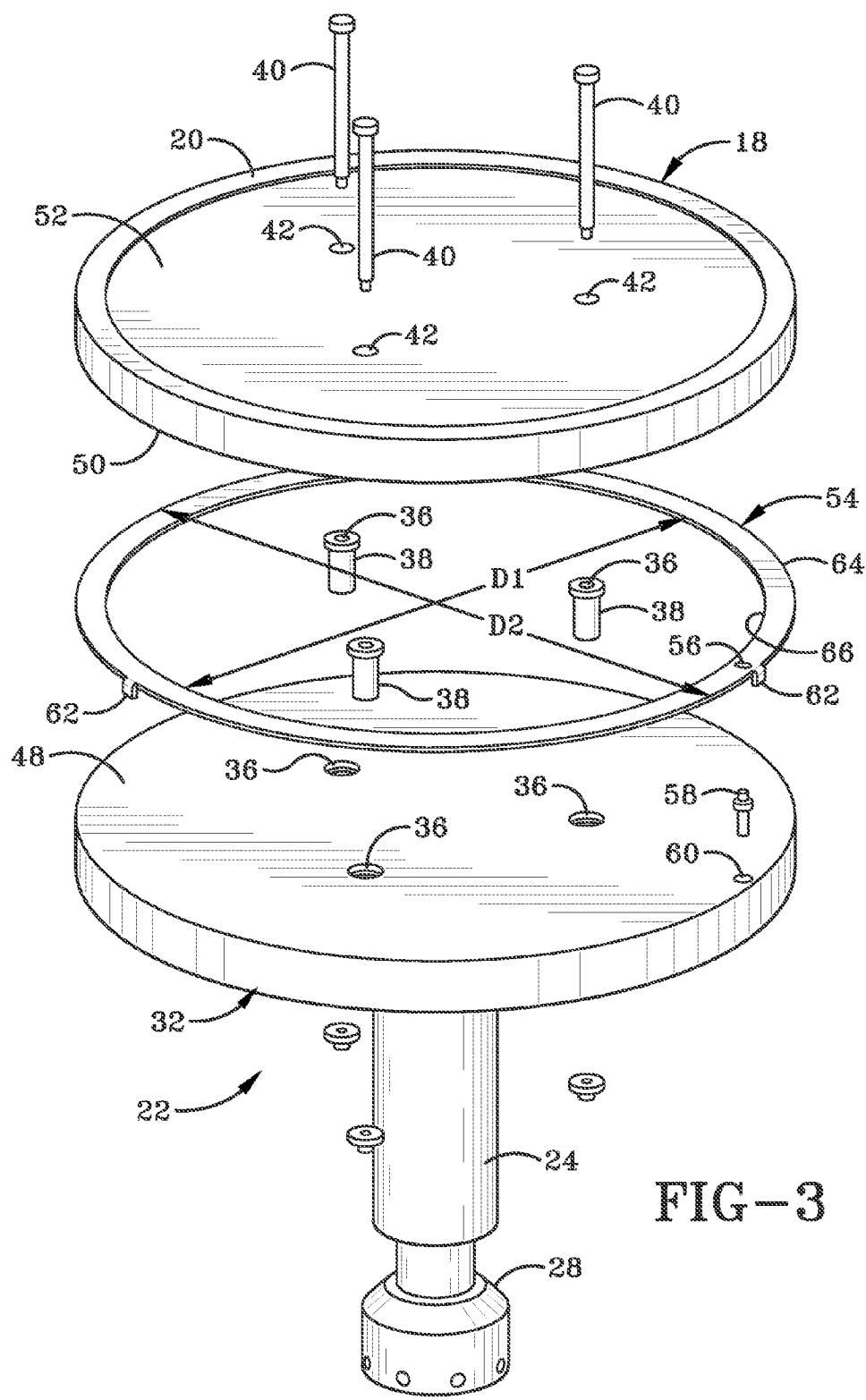
FIG. 3 is an exploded perspective view of a substrate support assembly with a shim.

Referring now to FIGS. 2 and 3, an assembled view and an exploded view, respectively, of susceptor 18 and heater 22 are shown. Susceptor top surface 52 is shown generally recessed below shoulder 20 and having three through holes 42 therein. A shim 54 is positioned between susceptor bottom surface 50 and heating portion top surface 48. In one implementation, shim 54 is generally a thin, disc shaped component with an inner diameter $D_1$ and an outer diameter $D_2$. $D_1$ is approximately equal to $S_1$, while $D_2$ is approximately equal to $S_2$. Accordingly, the envelope defined by $D_1$ and $S_1$ is also approximately equal to the outside diameter of substrate 16 to ensure uniform heating of the substrate during processing. In one implementation, $D_1$ is approximately 296.4 mm, while $D_2$ is approximately 321.8 mm in a 300 mm wafer processing system. Diameters $D_1$ and $D_2$ will change accordingly in a 200 mm and a 450 mm processing environment.

Shim 54 also includes a locating aperture 56 arranged to engage a locating pin 58 positioned within hole 60 of heater 22. Locating aperture 56 and locating pin 58, although not mandatory for system use, provide stability and prevent rotational displacement of shim 54 during operation. Shim 54 may also include a plurality of locating tabs 62 to limit relative movement between heating portion 32 of heater 22 and shim 54. In one implementation, locating tabs 62 are disposed along a perimeter 64 of shim 54 and extend at an angle from perimeter 64. Any suitable number of locating tabs 62 may be utilized, while the illustrated non-limiting implementation shows three locating tabs, two or more locating tabs may be incorporated. Further, the illustrated locating tabs are shown extending downward into contact with heater 22 and heating portion 32 thereof, but may just as easily extend upwards and contact susceptor 18 without departing from the spirit and scope of the disclosure. Still yet, the locating tabs 62 may extend from perimeter 64 at any angle or in any shape/orientation so long as relative positioning is maintained between the susceptor 18, the heater 22, and the shim 54.

In one implementation, shim 54 may have a cross-sectional thickness between 0.1 mm and 2 mm, although any suitable cross-sectional thickness may be utilized. In one preferred implementation, the shim cross-sectional thickness is approximately 0.5 mm. Shim 54 may be composed of any suitable highly thermal conductive material including, but not limited to, aluminum, titanium, stainless steel, or Thermal Pyrolytic Graphite from Momentive Performance Materials Inc. In one implementation, shim 54 may be composed of any 1000 series aluminum. Advantageously, the relative thin shim 54 is cheap to manufacture and can be a consumable part with chamber changeovers or with replacement of the susceptor. Still further, shim 54 prevents fusion of the susceptor and heater, thereby significantly reducing the heater refurbishment costs.

Figure 4:
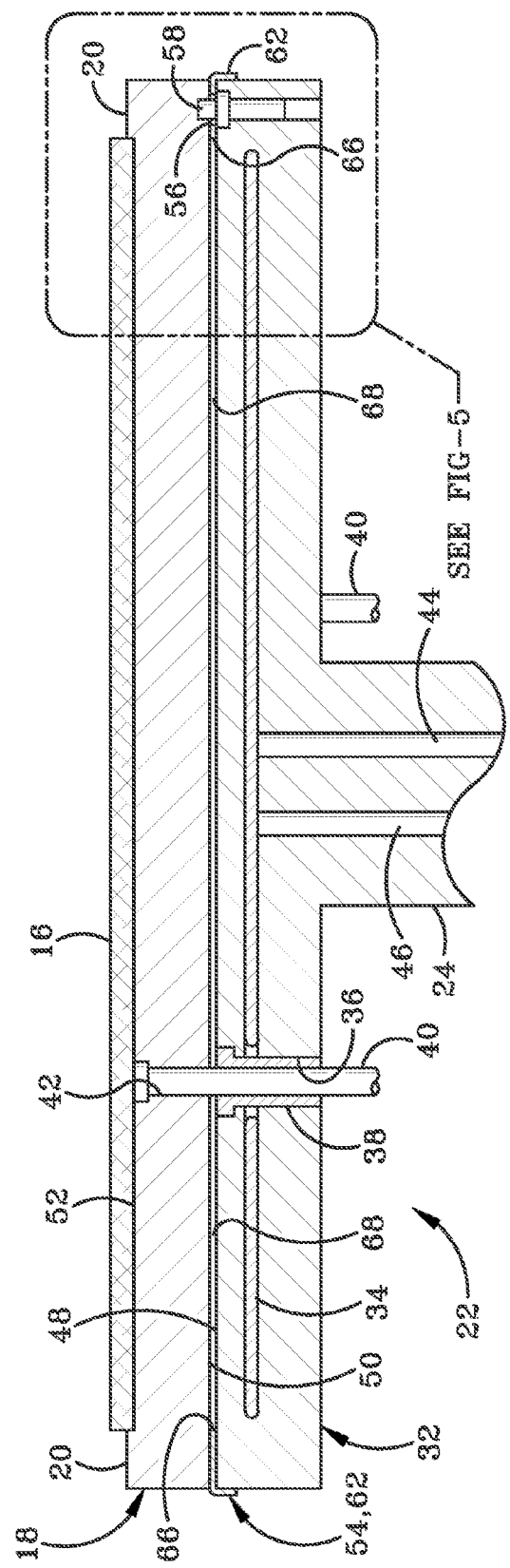
FIG. 4 is a cross-sectional view of a substrate support assembly with a shim.
Figure 5:
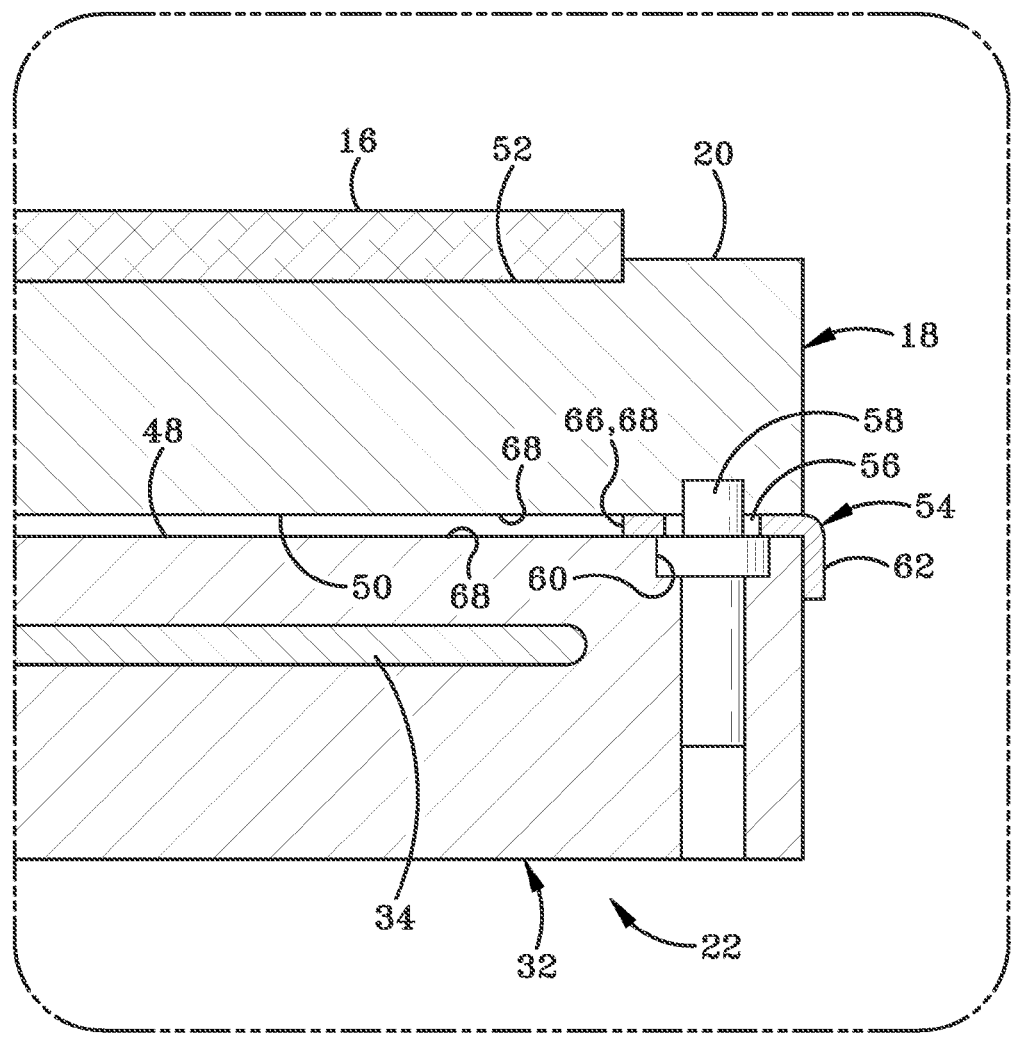
FIG. 5 is an enlarged view of the section labeled FIG. 5 in FIG. 4.

FIGS. 4 and 5 illustrate cross-sectional views of the susceptor 18, heater 22, and shim 54. Shim 54 includes an inner surface 66 which, in combination with bottom surface 50 of susceptor 18 and top surface 48 of heater 22, defines a gap 68 between susceptor 18 and heater 22. In this arrangement, gap 68 ensures that the only contact between susceptor 18 and heater 22 is through shim 54 and is located radially outward of substrate 16 in one implementation. Gap 68 functions to provide radiation heating to bottom surface 50 of susceptor 18 adjacent gap 68. Specifically, heating element 34 is resistively heated and transfers heat energy to top surface 48 of heating portion 32 surrounded by shim 54. The heat energy is then transferred through gap 68 and to susceptor 18 through thermal radiation. Further, the thermal radiation allows for a more precise control of the temperature gradient across the susceptor and has been shown to reduce the temperature by as much as 40 degrees centigrade.

In addition to providing thermal radiation through gap 68, the highly thermally conductive composition of shim 54 ensures sufficient conductive heat transfer from heater 22 into the outer edges of susceptor 18 and shoulder 20 to maintain the edge of the substrate at an appropriate processing temperature. Still further, reaction chamber 10 may be placed in a vacuum state, wherein the radiant heat transfer through gap 68 is not affected by the vacuum condition.

In operation, shim 54 also greatly reduces chamber cleaning and reaction chamber downtime while also reducing chamber consumables. Specifically, the significant amount of heat transfer between the susceptor and the heater without shim 54 can lead to fusing the susceptor 18 to heater 22 and requiring removal of the entire heater assembly. With the addition of the shim 54, the old susceptor 18 and shim 54 may be removed from the chamber and quickly replaced with a new susceptor 18 and shim 54 in a fraction of the time normally required. In another implementation, the susceptor and shim may be a single assembly that can be replaced together and separately refurbished or replaced as necessary, thereby still further reducing downtime. In summary, the prevention of fusion between susceptor 18 and heater 22 greatly reduces downtime and consumables costs.

Figure 6:
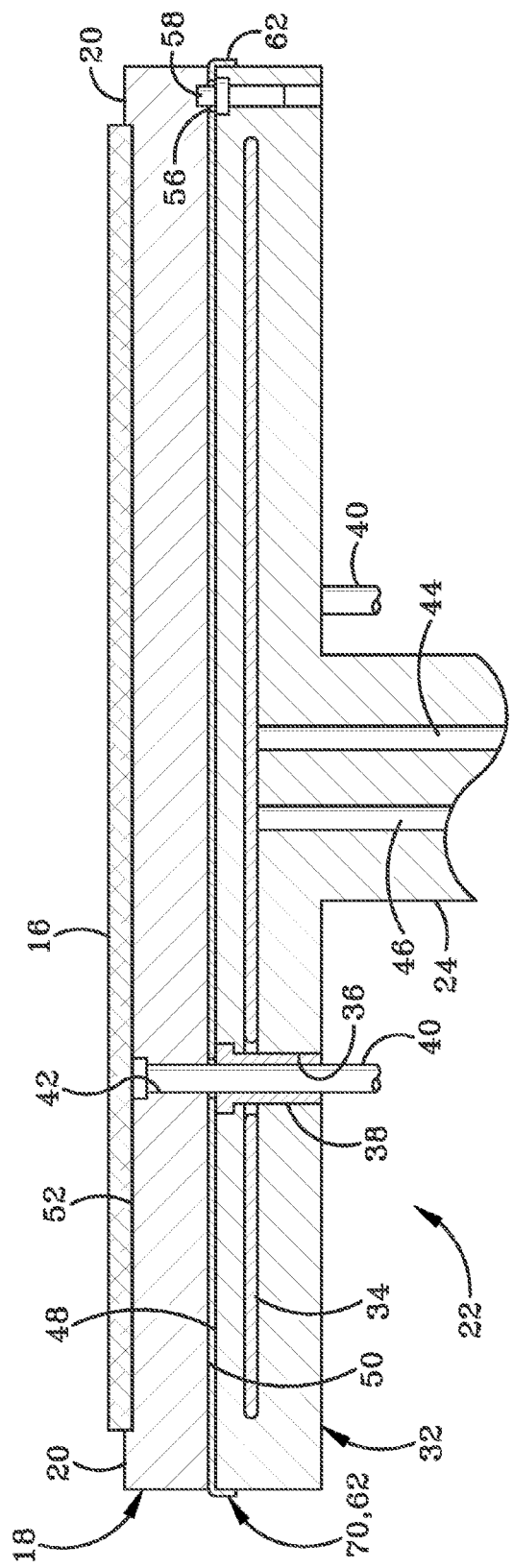
FIG. 6 is a cross-sectional view of a substrate support assembly with a shim.

FIG. 6 illustrates an alternative shim implementation wherein a solid disc shim 70 is positioned between susceptor 18 and heater 22. In this implementation, solid disc shim 70 is once again composed of any suitable highly thermally conductive material and provides heating to susceptor 18 through conductive heat transfer only. While the implementation disclosed in FIG. 6 does not provide a gap for radiant thermal transfer, shim 70 does provide the same fusion resistant properties of shim 54, whereby the susceptor 18 and heater 22 will not fuse together with shim 70 there between. Accordingly, the arrangement, orientation, and function of shim 70 is similar to shim 54 with the exception of excluding gap 68 and the radiant thermal transfer created by gap 68.

Figure 7:
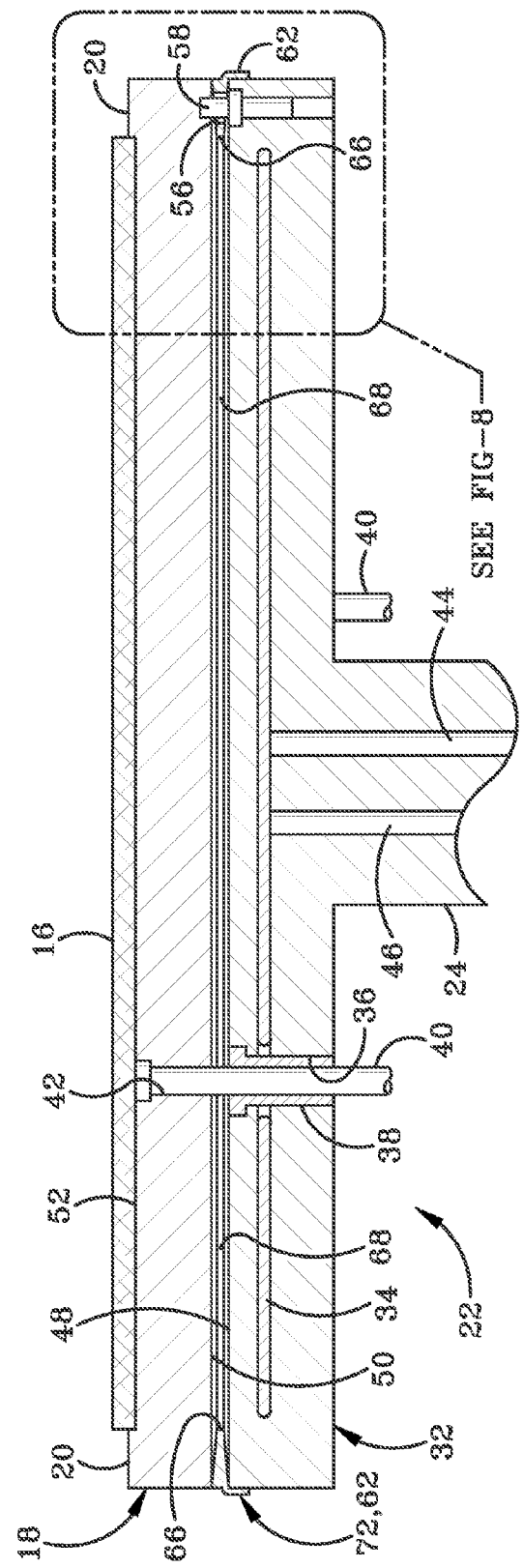
FIG. 7 is a cross-sectional view of a substrate support assembly with a shim.
Figure 8:
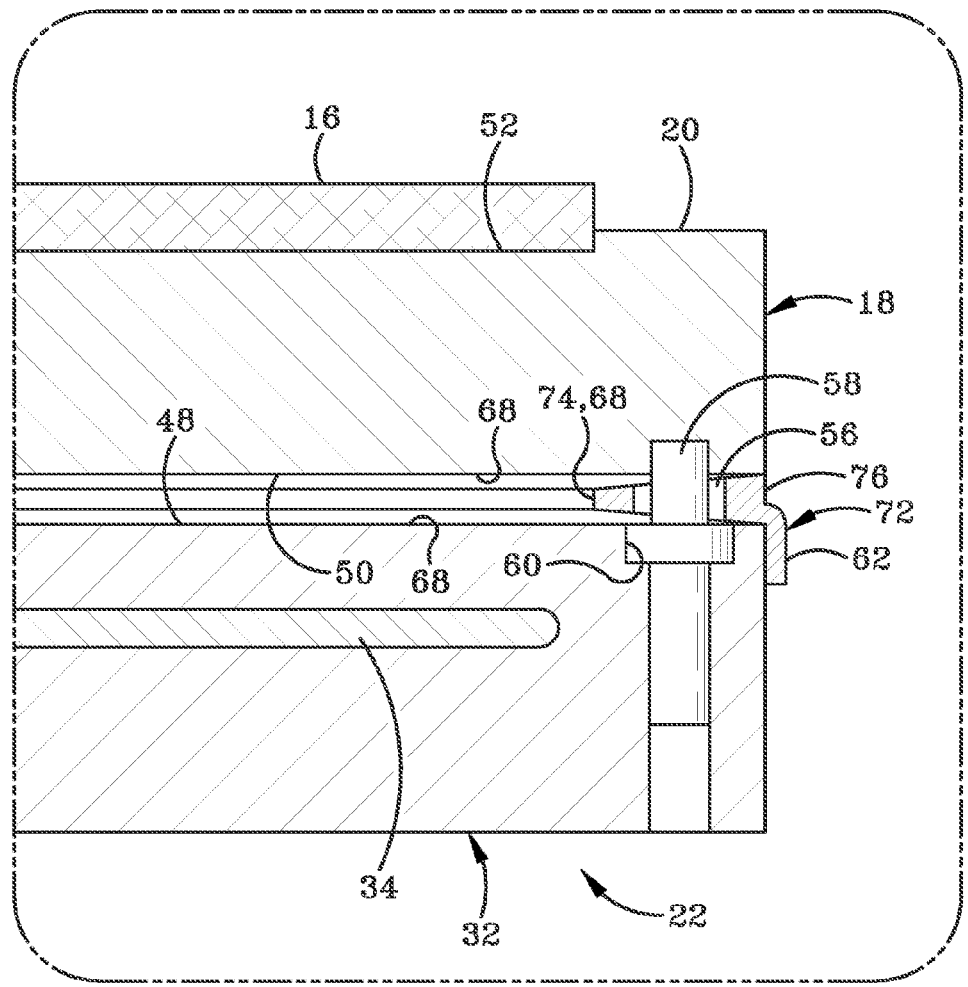
FIG. 8 is an enlarged view of the section labeled FIG. 8 in FIG. 7.

FIGS. 7 and 8 illustrate another alternative shim implementation wherein a variable shim 72 is positioned between susceptor 18 and heater 22. Heating portion top surface 48 and susceptor bottom surface 50 may each have complimentary angles radially outward of substrate 16 to receive a complimentary shaped variable shim 72. In one aspect, the variable shim 72 includes an increasing cross-sectional thickness from the inner radius to the outer radius. In a second aspect (not shown), the variable shim may include a decreasing cross-sectional thickness from the inner radius to the outer radius. Similar to shim 54, variable shim 72 includes an inner surface 74 and an outer perimeter 76 with locating tabs 62. The variable shim 72 allows tuning of the heat transfer characteristics between the susceptor 18 and heater 22 by selectively increasing, decreasing, or creating a gap in shim 72.

In operation, all three shims 54, 70, and 72 each provide fusion resistance and reduce consumables as well as reactor downtime. Shims 54 and 72 also provide the advantage of better heat transfer between heater 22 and susceptor 18 in the form of radiant heat within gap 68. The present disclosure also provides a method of conducting thermal energy in a reaction chamber or processing space consisting of positioning a shim with an opening or hole therein between a susceptor bottom surface and a heater top surface and activating the heater to provide both radiant thermal energy transfer and conductive thermal energy transfer to the susceptor and substrate in a vacuum environment or ambient pressure environment.

These and other embodiments for methods and apparatus for a reaction chamber having a shim between the susceptor and heater may incorporate concepts, embodiments, and configurations as described with respect to embodiments of apparatus for heaters described above. The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, any connecting lines shown in the various figures are intended to represent exemplary functional relationships and/or physical couplings between the various elements. Many alternative or additional functional relationship or physical connections may be present in the practical system, and/or may be absent in some embodiments.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

What is claimed is:

1. A substrate supporting assembly in a reaction space comprising:
    a heater;
    a substrate support member having a top surface to receive a substrate and a shoulder about the top surface; and
    a shim positioned between the heater and the substrate support member, wherein the shim comprises an inner surface defining a perimeter of a gap, wherein the shim comprises an inner perimeter approximately equal an outside perimeter of the top surface and an outer perimeter approximately equal the outer perimeter of the shoulder, and
    wherein the heater provides radiant heat via the gap to the substrate support member.

2. The substrate supporting assembly of claim 1 wherein the shim is removably secured to the heater and the substrate support member.

3. The substrate supporting assembly of claim 1 wherein the heater comprises a plurality of through holes that extend through the heater, and the substrate supporting assembly comprises lift pins that are received by the plurality of through holes.

4. The substrate supporting assembly of claim 1 wherein the gap is further defined by a bottom surface of the substrate support member and a top surface of the heater.

5. The substrate supporting assembly of claim 1 wherein the substrate support member further comprises a shoulder positioned radially outside of a substrate support position and wherein the shim inner surface is radially aligned with the substrate support member shoulder.

6. The substrate supporting assembly of claim 1 wherein a temperature of the substrate support member is modified by both conductive thermal energy and radiant thermal energy from the heater.

7. The substrate supporting assembly of claim 1 wherein a diameter of the substrate is selected from the group consisting of 200 mm, 300 mm and 450 mm.

8. The substrate supporting assembly of claim 7 wherein the reaction space is under a vacuum condition during substrate processing.

9. The substrate supporting assembly of claim 8 wherein the radiant thermal energy transfer component is greater than the conductive thermal energy transfer component.

10. The substrate supporting assembly of claim 1 wherein the shim is composed of a material selected from the group consisting of aluminum, titanium, and stainless steel.

11. The substrate supporting assembly of claim 1 wherein the shim further comprises a cross-sectional thickness between 0.1 mm and 2 mm.

12. The substrate supporting assembly of claim 11 wherein the shim cross-sectional thickness is 0.5 mm.

13. The substrate supporting assembly of claim 1 wherein the shim further comprises a radially non-uniform cross-sectional thickness.

14. The substrate supporting assembly of claim 13 wherein the shim cross-sectional thickness increases from a shim inner surface to a shim outer surface.

15. The substrate supporting assembly of claim 1 wherein the shim further comprises a plurality of locating tabs for maintaining a position of the shim on the heater or the substrate support member.

16. The substrate supporting assembly of claim 1 wherein the heater further comprises a shaft.

17. A reaction chamber for processing a wafer comprising:
a plurality of walls defining a reaction space;
a heater movably positioned within the reaction space;
a susceptor having a top surface to receive a substrate and a shoulder about the top surface, the susceptor positioned within the reaction space;
a shim having an inner surface comprising an inner perimeter approximately equal an outside perimeter of the top surface and an outer perimeter approximately equal an outer perimeter of the shoulder, the shim located between the heater and the susceptor and preventing direct contact between the heater and the susceptor; and
a gap formed between an inner surface of the shim, a bottom surface of the susceptor; and a top surface of the heater,
wherein the gap is positioned inward of a radial envelope defined by an outer perimeter of the substrate, and
wherein the gap allows radiant heating of a bottom surface of the susceptor.

18. The reaction chamber for processing a wafer of claim 17 wherein the shim is removably secured between the heater and the susceptor.

19. The reaction chamber for processing a wafer of claim 17 wherein the shim comprises a cross-sectional thickness between 0.1 mm and 2 mm.

20. The reaction chamber for processing a wafer of claim 17 wherein the shim is composed of a material selected from the group consisting of aluminum, titanium, and stainless steel.

21. A method of heating a susceptor comprising the steps of:
providing a heater having a heating element within a reaction chamber;
placing a shim on the heater;
aligning the shim using apertures within the shim and pins extending from the heater;
placing a susceptor on the shim, wherein the shim comprises an inner surface defining a perimeter of a gap;
activating the heating element; and,
transferring thermal energy from the heater to the susceptor by conduction and radiation.

22. The method of claim 21 further comprising the step of placing the reaction chamber under a vacuum during a wafer processing step.

* * * * *